(12) United States Patent
Derraa et al.

(10) Patent No.: US 7,402,512 B2
(45) Date of Patent: *Jul. 22, 2008

(54) HIGH ASPECT RATIO CONTACT STRUCTURE WITH REDUCED SILICON CONSUMPTION

(75) Inventors: Ammar Derraa, Boise, ID (US); Sujit Sharan, Chandler, AZ (US); Paul Castrovillo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 309 days.

This patent is subject to a terminal disclaimer.

(21) Appl. No.: 11/153,091

(22) Filed: Jun. 15, 2005

(65) Prior Publication Data

US 2005/0233577 A1    Oct. 20, 2005

Related U.S. Application Data

(60) Continuation of application No. 10/931,854, filed on Sep. 1, 2004, now Pat. No. 6,908,849, which is a division of application No. 09/944,903, filed on Aug. 30, 2001, now Pat. No. 6,858,904.

(51) Int. Cl.
*H01L 21/4763* (2006.01)
(52) U.S. Cl. .................. 438/618; 438/682; 257/E21.165
(58) Field of Classification Search .................. 438/618, 438/682
See application file for complete search history.

(56) References Cited

U.S. PATENT DOCUMENTS

| | | | |
|---|---|---|---|
| 4,963,511 A | 10/1990 | Smith | |
| 5,032,233 A | 7/1991 | Yu et al. | |
| 5,187,638 A | 2/1993 | Sandhu et al. | |
| 5,231,056 A | 7/1993 | Sandhu | |
| 5,240,739 A | 8/1993 | Doan et al. | |
| 5,278,100 A | 1/1994 | Doan et al. | |
| 5,292,677 A | 3/1994 | Denison | |
| 5,312,774 A | 5/1994 | Nakamura et al. | |
| 5,340,765 A | 8/1994 | Dennison et al. | |
| 5,344,792 A | 9/1994 | Sandhu et al. | |
| 5,346,844 A | 9/1994 | Cho et al. | |
| 5,362,666 A | 11/1994 | Dennison | |
| 5,376,405 A | 12/1994 | Doan et al. | |
| 5,387,550 A | 2/1995 | Cheffings et al. | |

(Continued)

FOREIGN PATENT DOCUMENTS

JP       06196439 A2     7/1994

(Continued)

*Primary Examiner*—Alexander G Ghyka
(74) *Attorney, Agent, or Firm*—Knobbe, Martens, Olson & Bear LLP

(57) ABSTRACT

A high aspect ratio contact structure formed over a junction region in a silicon substrate comprises a titanium interspersed with titanium silicide layer that is deposited in the contact opening and directly contacts an upper surface of the substrate. Silicon-doping of CVD titanium, from the addition of $SiH_4$ during deposition, reduces consumption of substrate silicon during the subsequent silicidation reaction in which the titanium reacts with silicon to form a titanium silicide layer that provides low resistance electrical contacts between the junction region and the silicon substrate. The contact structure further comprises a titanium nitride contact fill that is deposited in the contact opening and fills substantially the entire contact opening.

6 Claims, 6 Drawing Sheets

U.S. PATENT DOCUMENTS

| | | |
|---|---|---|
| 5,444,006 A | 8/1995 | Han et al. |
| 5,488,011 A | 1/1996 | Figura et al. |
| 5,504,038 A | 4/1996 | Chien et al. |
| 5,510,651 A | 4/1996 | Maniar et al. |
| 5,596,221 A | 1/1997 | Honda |
| 5,610,099 A | 3/1997 | Stevens et al. |
| 5,612,574 A | 3/1997 | Summerfelt et al. |
| 5,644,166 A | 7/1997 | Honeycutt et al. |
| 5,717,250 A | 2/1998 | Schuele et al. |
| 5,731,242 A | 3/1998 | Parat et al. |
| 5,756,394 A | 5/1998 | Manning |
| 5,760,434 A | 6/1998 | Zahurak et al. |
| 5,773,363 A | 6/1998 | Derderian et al. |
| 5,793,076 A | 8/1998 | Fazan et al. |
| 5,801,916 A | 9/1998 | New |
| 5,849,624 A | 12/1998 | Fazan et al. |
| 5,854,104 A | 12/1998 | Onishi et al. |
| 5,872,056 A | 2/1999 | Manning |
| 5,929,526 A | 7/1999 | Srinivasan et al. |
| 5,963,832 A | 10/1999 | Srinivasan et al. |
| 5,972,747 A | 10/1999 | Hong |
| 5,989,952 A | 11/1999 | Jen et al. |
| 6,043,529 A | 3/2000 | Hartner et al. |
| 6,066,541 A | 5/2000 | Hsieh et al. |
| 6,127,732 A | 10/2000 | Batra et al. |
| 6,140,230 A | 10/2000 | Li |
| 6,147,405 A | 11/2000 | Hu |
| 6,171,952 B1 | 1/2001 | Sandhu et al. |
| 6,262,485 B1 | 7/2001 | Thakur et al. |
| 6,333,547 B1 | 12/2001 | Tanaka et al. |
| 6,348,709 B1 | 2/2002 | Graettinger et al. |
| 6,355,558 B1 | 3/2002 | Dixit et al. |
| 6,404,058 B1 | 6/2002 | Taguwa |
| 6,524,951 B2 * | 2/2003 | Hu .......................... 438/649 |
| 6,555,880 B2 * | 4/2003 | Cabral et al. ................ 257/384 |
| 6,908,848 B2 * | 6/2005 | Koo .......................... 438/627 |

FOREIGN PATENT DOCUMENTS

| | | |
|---|---|---|
| WO | WO 98/15013 | 4/1998 |

\* cited by examiner

HIGH ASPECT RATIO CONTACT STRUCTURE WITH REDUCED SILICON CONSUMPTION

RELATED APPLICATION

This application is a continuation of prior application Ser. No. 10/931,854, filed Sep. 1, 2004, now U.S. Pat. No. 6,908,849 which is a divisional application of application Ser. No. 09/944,903, filed Aug. 30, 2001, now U.S. Pat. No. 6,858,904, which are hereby incorporated by reference in their entirety. This application is also related to co-pending application Ser. No. 09/945,065, filed Aug. 30, 2001, which is hereby incorporated by reference.

BACKGROUND OF THE INVENTION

1. Field of the Invention

This invention relates to integrated circuits, and more particularly, to a high aspect ratio contact structure with reduced consumption of silicon in the junction region.

2. Description of the Related Art

A high density integrated circuit typically includes numerous electrical devices and conductors formed on multiple layers of conducting and semiconducting material that are deposited and patterned in sequence onto a substrate surface. An integrated circuit is operable when its individual components are interconnected with an external source and with one another. In particular, designs of more complex circuits often involve electrical interconnections between components on different layers of circuit as well as between devices formed on the same layer. Such electrical interconnections between components are typically established through electrical contacts formed on the individual components. The contacts provide exposed conductive surfaces on each device where electrical connections can be made. For example, electrical contacts are usually made among circuit nodes such as isolated device active regions formed within a single-crystal silicon substrate. However, as the contact dimensions of devices become smaller, the contact resistance and the sheet resistance of the contacts also increase.

To address this problem, refractory metal silicides have been used for local interconnections to provide low resistance electrical contacts between device active regions within the silicon substrate. One common method of forming metal silicides is a self-aligned silicide process, often referred to as silicidation. In this process, a thin layer of refractory metal, such as titanium, is deposited over a dielectric area and through contact openings formed on the dielectric area to contact underlying silicon circuit elements, such as a source and drain active regions formed within a silicon substrate. The structure is then annealed to form a silicide, such as titanium silicide ($TiSi_x$), at a high temperature. During annealing, the deposited titanium reacts with the silicon in the substrate to form $TiSi_x$ inside the contact openings adjacent the active regions. The titanium and silicon react with each other to form a silicide thick enough to provide low sheet resistance. The process is referred to as "self-aligning" because the $TiSi_x$ is formed only where the metal layer contacts silicon, for example, through the contact openings. As such, titanium that overlies the dielectric areas surrounding the contact openings, along the sidewalls of the openings, and any other non-silicon surfaces remains unreacted.

The conventional silicidation process is not entirely suitable for devices having relatively shallow contact junctions. Shallow junction structures may be damaged when the silicidation reaction consumes a disproportionate amount of silicon from the relatively shallow junction region. To address this problem, a titanium silicide film can be directly deposited on the silicon substrate to reduce silicon consumption in the junction area. The $TiSi_x$ film can be deposited using low pressure chemical vapor deposition (LPCVD) or chemical vapor deposition (CVD) processes. However, there are numerous disadvantages associated with forming a conventional $TiSi_x$ film on the substrate. For example, the LPCVD process used typically requires reaction temperatures in excess of 700 C and the conventional CVD process tends to produce a $TiSi_x$ film with high bulk resistivity.

Moreover, subsequent to forming the $TiSi_x$ film, a diffusion barrier layer such as titanium nitride (TiN) is typically formed on the contact structure. The TiN layer inhibits subsequently deposited contact metal from diffusing into the insulating layer surrounding the contact structure. Typically, TiN is deposited on the $TiSi_x$ layer in the contact openings as well as on the unreacted Ti remaining on the dielectric layer and on the sidewalls of the contact openings. Disadvantageously, TiN forms a relatively weak bond with Ti and is likely to peel off from surfaces where TiN has contact with Ti. To address this problem, the Ti deposited on the dielectric layer and on the sidewalls of the contact opening can be removed prior to deposition of TiN. However, the Ti removal process is likely to add to the cost and complexity of the fabrication process.

Furthermore, once the diffusion barrier layer is formed, conductive contact fills such as tungsten can be deposited into the contact openings. The contact fills are typically deposited into the contact openings by physical deposition processes such as sputtering. However, the step coverage provided by sputtering and other physical deposition processes is often inadequate for high aspect ratio contact openings because it can be particularly difficult to physically deposit uniform layers of contact fill into high aspect ratio contact openings.

Hence, from the foregoing, it will be appreciated that there is a need for a method of improving the step coverage of contact fills in high aspect ratio contact structures. There is also a need for a contact structure having improved contact fill adhesion. Furthermore, there is also a need for a method of reducing silicon consumption in shallow junction regions during silicidation process. To this end, there is a particular need for a high aspect ratio contact structure that provides a more uniform step coverage and improved TiN adhesion. There is also a particular need for a method of reducing silicon consumption in shallow junction regions during the formation of the titanium silicide layer.

SUMMARY OF THE INVENTION

In one aspect, the preferred embodiments of the present invention comprise an integrated circuit having a silicon substrate and an insulating layer formed on an upper surface of the substrate wherein a contact opening is formed in the insulating layer. Preferably, the contact opening extends from an upper surface of the insulating layer to the upper surface of the substrate. Furthermore, a conductive contact is deposited in the opening in a manner such that the conductive contact directly contacts the upper surface of the substrate. Preferably, the conductive contact comprises a titanium layer interspersed with titanium silicide. The integrated circuit further comprises a conductive contact fill that is deposited on an upper surface of the conductive contact in a manner such that the contact fill fills substantially the entire contact opening. Preferably, the contact fill comprises titanium nitride that is chemically deposited into the opening and conforms to the contours of the opening.

In another aspect, the preferred embodiments of the present invention comprise a contact structure having a contact opening formed over a junction region in a silicon substrate. The contact structure comprises a conductive contact layer comprising titanium interspersed with titanium silicide. In one embodiment, the layer of titanium interspersed with titanium silicide is approximately 100 Å thick. In another embodiment, the titanium layer interspersed with titanium silicide comprises approximately 10% silicon. Preferably, the conductive contact layer is deposited directly on an upper surface of the silicon substrate over the junction region. In one embodiment, the junction region is less than about 1 µm deep. Advantageously, the titanium silicide in the conductive contact layer reduces consumption of silicon from the junction region during a subsequent silicidation reaction between silicon in the substrate and titanium in the conductive contact layer. The contact structure further comprises a diffusion barrier layer that is formed on an upper surface of the conductive contact layer. A contact fill is also formed on an upper surface of the diffusion barrier layer. Preferably, the contact fill comprises titanium nitride that substantially fills the entire contact opening.

In yet another aspect, the preferred embodiments of the present invention comprise a method of fabricating a contact structure on a silicon substrate. The method comprises forming an insulating layer on an upper surface of the substrate and forming an opening in the insulating layer. Preferably, the opening extends from an upper surface of the insulating layer to the upper surface of the substrate. The method further comprises forming a titanium layer interspersed with titanium silicide in the opening. Preferably, the titanium layer interspersed with titanium silicide is deposited in opening and directly contacts the upper surface of the substrate. The titanium layer subsequently reacts with silicon in the substrate to form a titanium silicide layer. Advantageously, the titanium silicide interspersed in the titanium layer reduces the consumption of silicon during the formation of the titanium silicide layer. The method further comprises forming a conductive contact fill in the opening. Preferably, the conductive contact fill comprises titanium nitride that is deposited directly on the titanium silicide layer and fills substantially the entire opening. These and other advantages of the present invention will become more fully apparent from the following description taken in conjunction with the accompanying drawings.

DETAILED DESCRIPTION OF THE PREFERRED EMBODIMENT

References will now be made to the drawings wherein like numerals refer to like parts throughout. While the preferred embodiments are illustrated in the context of contact openings over active regions in silicon substrates, it will be recognized by one skilled in the art of semiconductor fabrication that the invention will have application whenever electrical contact to silicon elements is desirable. Furthermore, the term "substrate" as used in the present application, refers to one or more semiconductor layers or structures which include active or operable portions of semiconductor devices.

Figure 1:
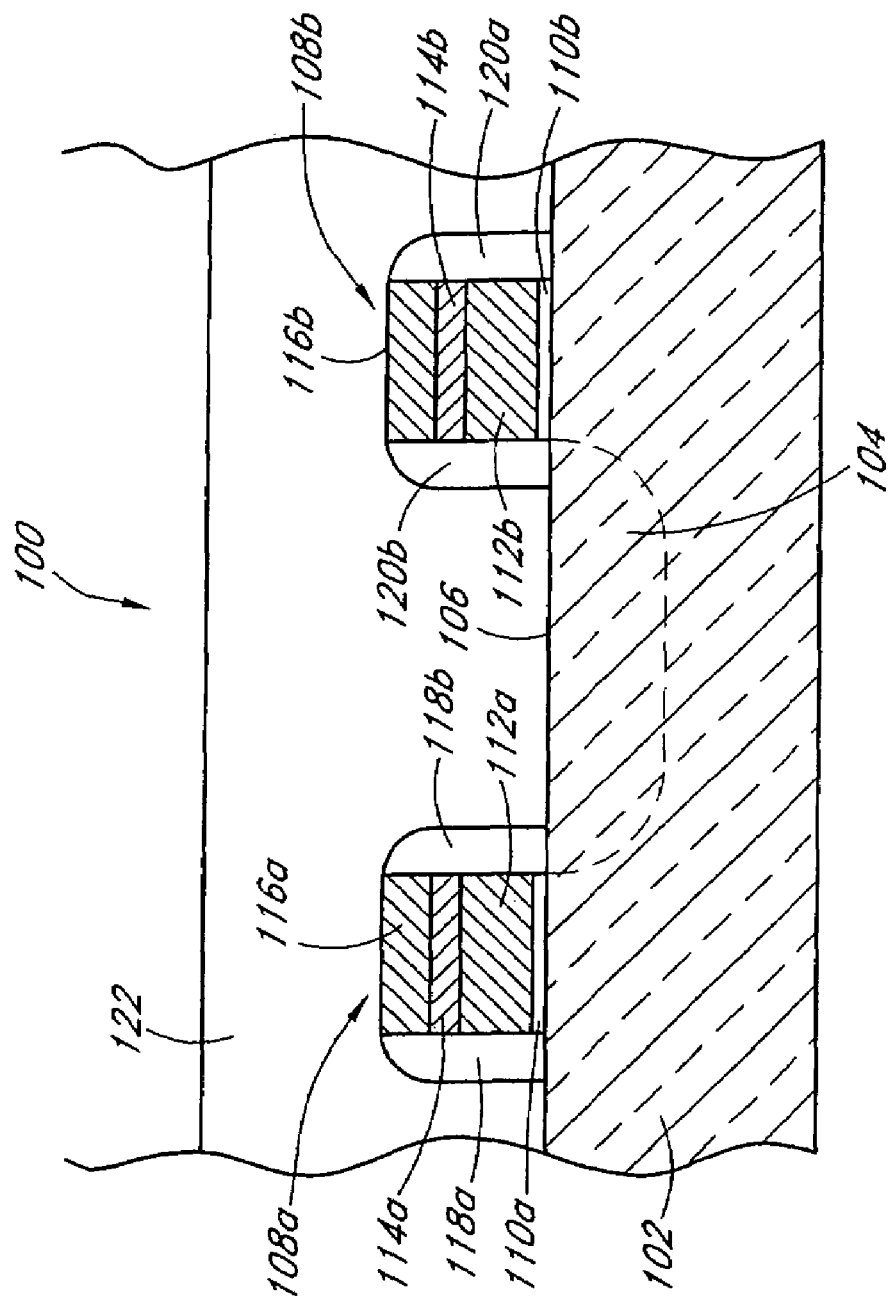
FIG. 1 illustrates a schematic cross sectional view of a partially fabricated integrated circuit of one preferred embodiment of the present invention.

FIG. 1 illustrates a schematic sectional view of a semiconductor structure 100 of the preferred embodiment. As FIG. 1 shows, the semiconductor structure 100 generally comprises a substrate 102 having a highly doped silicon active area 104, which may comprise a transistor source or drain, defined below an upper surface 106 of the substrate 102. Furthermore, two gate structures 108a, 108b are formed over the silicon substrate 102 adjacent the active area 104. Each of the gate structures 108a, 108b has a thin gate oxide layer 110a, 110b, a polysilicon gate electrode layer 112a, 112b, a metallic layer 114a, 114b, a protective cap layer 116a, 116b, and side wall spacers 118a, 118b, 120a, 120b to protect the gate structures. As FIG. 1 further shows, an insulating layer 122 is formed over the gate structures 108a, 108b and the active area 104 on the silicon substrate 102. Preferably, the insulating layer 122 is comprised of borophosphosilicate (BPSG) or other generally known insulating material.

Figure 2:
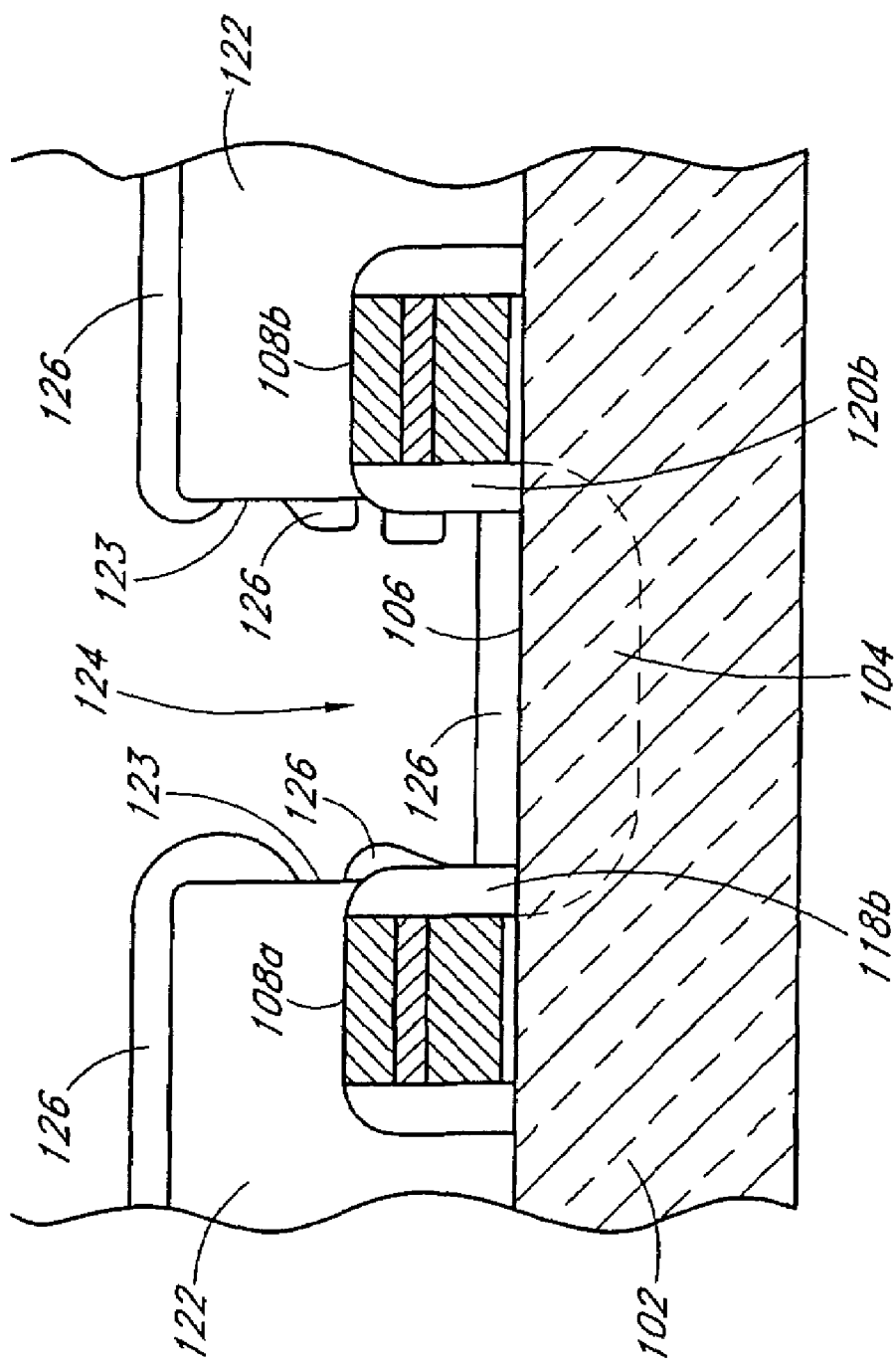
FIG. 2 illustrates a schematic cross sectional view of the integrated circuit of FIG. 1, showing the formation of a metal layer in the contact opening.

With reference to FIG. 2, a contact opening 124 is formed through the insulating layer 122 over the active area 104 to provide electrical contact to the active area 104. Preferably, the contact opening 124 is defined by the insulating layer 122, inner side wall spacers 118b, 120b, and the active area 104. In one embodiment, the contact opening 124 has an aspect ratio of at least 10:1. In another embodiment, the contact opening 124 has an aspect ratio of at least 5:1. As FIG. 2 further shows, a layer of metal 126 is subsequently formed in the contact opening 124 and over the insulating layer 122. In one embodiment, the metal layer 126 comprises titanium (Ti). As shown in FIG. 2, most of the Ti is formed over an upper surface 106 of the active area 104 or junction region and the insulating layer 122 surrounding the contact opening 124 although some remaining titanium may also form on the side walls 123 of the contact opening 124 and top surface of the dielectric during the deposition process. Preferably, Ti is deposited using a plasma enhanced chemical vapor deposition (PECVD) process. In one embodiment, the PECVD process uses a gas mixture comprised of $TiCl_4$, Ar, $H_2$, and He. Furthermore, the reaction gas temperature is preferably about 650° C., the RF power is approximately 400 W and the chamber pressure is about 4 Torr.

Figure 3:
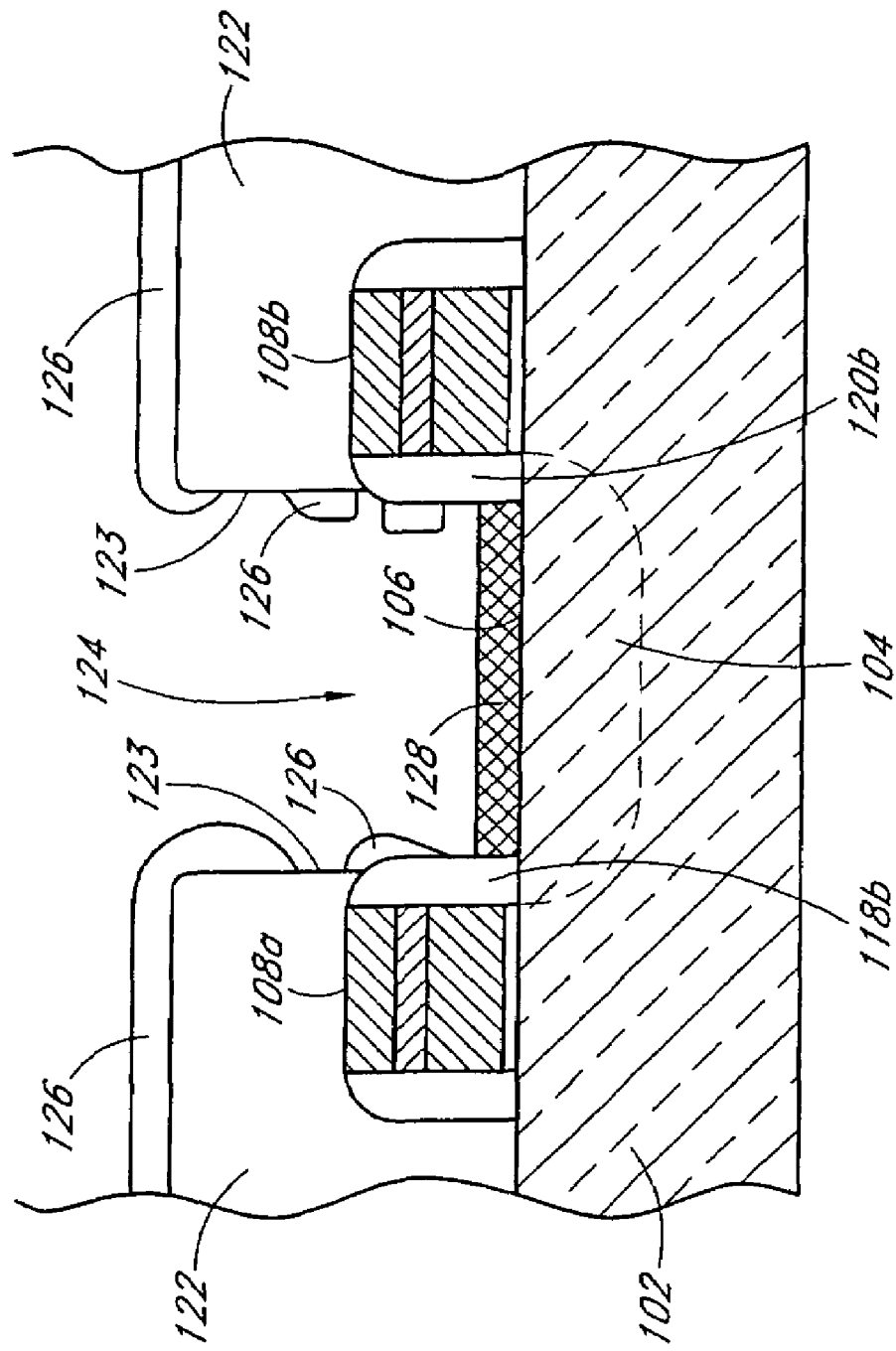
FIG. 3 illustrates a schematic cross sectional view of the integrated circuit of FIG. 2, showing the formation of a metal silicide layer adjacent the substrate.

The metal layer 126 is subsequently annealed during which the metal formed on the substrate surface 106 above the active area 104 reacts with silicon in the substrate 104 to form a layer of metal silicide 128 as shown in FIG. 3. As previously discussed, the metal silicide layer 128 is formed to provide low resistance electrical contacts between device active regions within the silicon substrate, particularly in high aspect ratio contact areas where the contact resistance is relatively high. In one embodiment, the metal silicide layer 128 comprises titanium silicide ($TiSi_x$). As shown in FIG. 3, the $TiSi_x$ layer 128 is formed over areas where Ti has contact with silicon in the substrate while portions of the Ti layer 126 deposited on the top of the insulating layer 122 and sidewalls 123 of the contact opening 124 remains unreacted.

In an alternative embodiment, during deposition of the metal layer 126, the metal can be doped with a small amount of silicon to form the metal silicide layer 128 on the substrate surface 106. In a preferred embodiment, titanium doped with silicon is deposited on the substrate surface by a PECVD process using a mixture comprising $TiCl_4$, Ar, $H_2$, He, and $SiH_4$. In one embodiment, the process temperature is 650° C., RF power 400 W and chamber pressure 4 Torr. Preferably, a small amount of about 10 sccm of $SiH_4$ is added to the gas mixture at about 400 W. Preferably, the process deposits a titanium rich layer interspersed with $TiSi_x$ formed by reactions between the deposited silicon and some of the titanium.

This embodiment is particularly useful for forming contact structures over shallow junction regions where titanium may consume sufficient silicon from the junction region to adversely affect the electrical integrity of the contact. In particular, leakage in the junction can occur when a disproportionate amount of silicon is consumed by the titanium. Advantageously, doping titanium with a small amount of silicon reduces consumption of silicon from the junction region and produces a titanium rich $TiSi_x$ film having improved chemical and mechanical properties. Furthermore, the silicon doped titanium layer does not appear to affect the electrical integrity of the contact.

Figure 4:
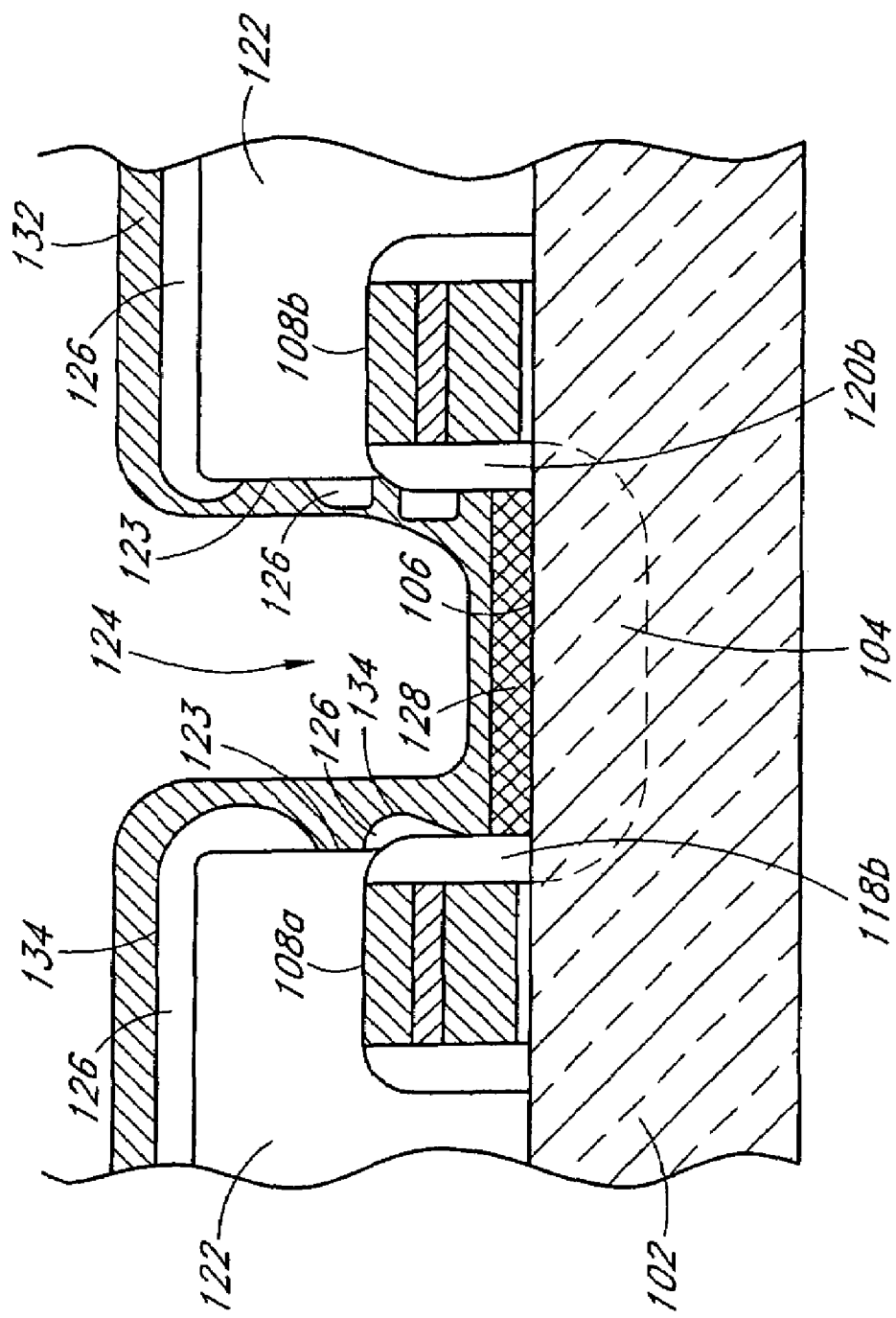
FIG. 4 illustrates a schematic cross sectional view of the integrated circuit of FIG. 3, showing the formation of a metal silicidation adhesion layer.

With reference to FIG. 4, subsequent to forming the metal silicide layer 128 adjacent the active area 104, a metal silicide adhesion layer 132 is formed on an upper surface 134 of the titanium film 126 deposited on the insulating layer 122 and side walls 123 of the contact opening 124. The metal silicide adhesion layer 132 preferably comprises $TiSi_x$ that is deposited by a PECVD process using a gas mixture comprising $SiH_4$, $TiCl_4$, Ar, $H_2$, and He. In one embodiment, the $TiSi_x$ adhesion layer 132 is deposited at a temperature of about 650° C., RF power of about 400 W and chamber pressure of about 4 Torr. Preferably, approximately 10 sccm of $SiH_4$ is introduced to the reaction process at about 400 W as a source of Si. In one embodiment, the $TiSi_x$ adhesion layer 132 is formed on the previously deposited Ti film 126 to promote adhesion between the Ti film 126 and a subsequently deposited contact fill. According to one theory, the Ti layer 126 contains an appreciable amount of chlorine that is left over from the PECVD reaction gas. It is believed that the chlorine present in the Ti layer tends to inhibit formation of stable chemical and mechanical bonds with TiN. The $TiSi_x$ adhesion layer on the other hand contains far less chlorine than the Ti layer and has chemical and mechanical properties that are more conducive to forming strong and stable bonds with TiN. In one embodiment, the $TiSi_x$ adhesion layer can be formed immediately following the Ti deposition process using the same equipment and substantially the same process parameters.

Figure 5:
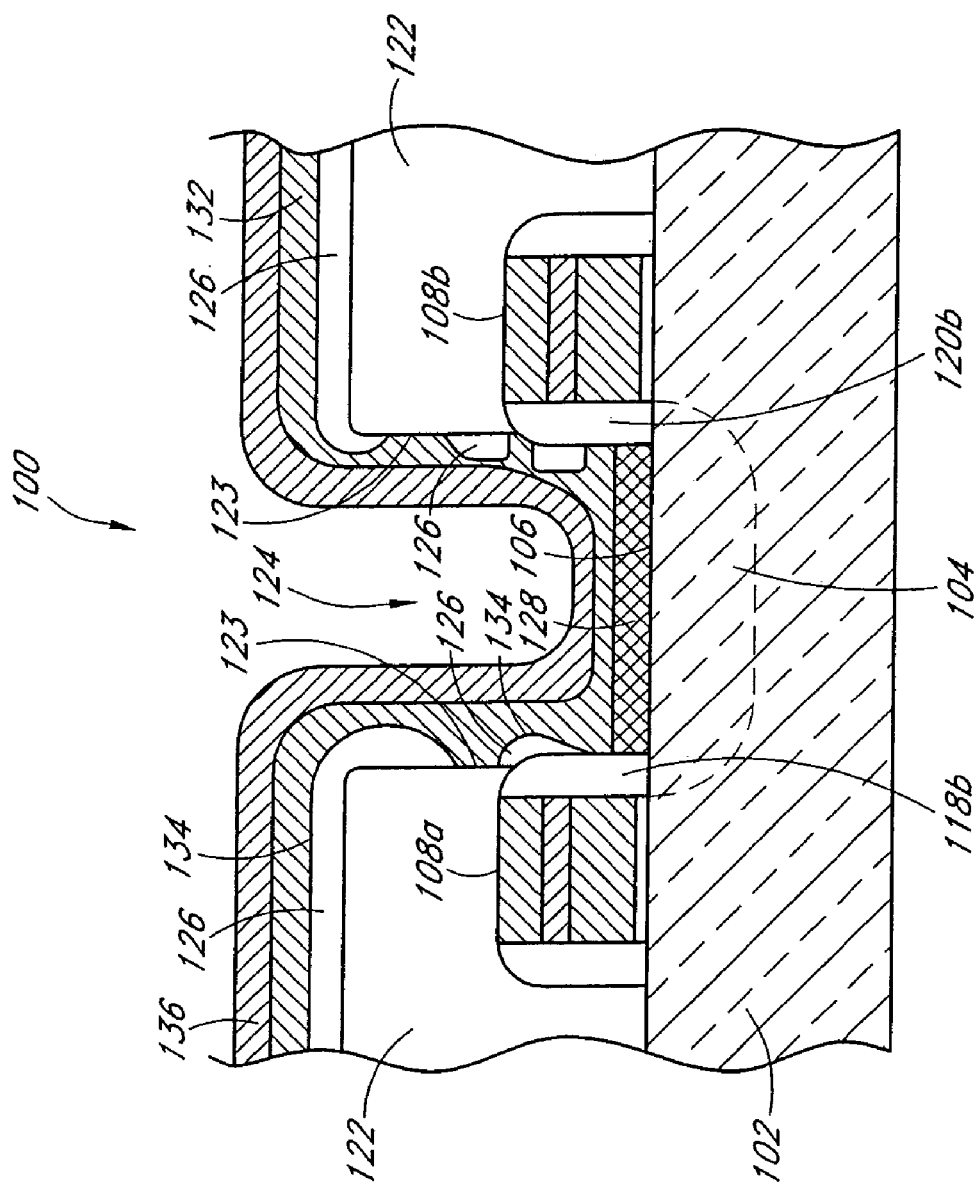
FIG. 5 illustrates a schematic cross sectional view of the integrated circuit of FIG. 4, showing the formation of a metal nitride diffusion layer.

As illustrated in FIG. 5, following the formation of the $TiSi_x$ adhesion layer 132, a metal nitride diffusion barrier layer 136 is formed on the $TiSi_x$ adhesion layer 132. Preferably, the metal nitride layer 136 comprises TiN that is deposited by a thermal CVD process from $TiCl_4$ and $NH_3$ precursors. In one embodiment, the processing temperature is approximately 600 C. The metal nitride layer 134 is typically used as a barrier layer against junction spiking and diffusion of metal into the insulating layers. As such, it is desirable for the metal nitride layer to form a stable and durable bond with the contact structure.

However, as previously discussed, metal nitrides layers such as TiN generally do not adhere well to the Ti metal 126 deposited on the sidewalls 123 of the contact structure and top surface of the dielectric. Consequently, the weak and unstable bonding between TiN and Ti often leads to TiN peeling off from the sidewalls 123 of the contact structure and top surface of the dielectric, particularly at locations where TiN makes contact with Ti. Advantageously, the contact structure 100 of the preferred embodiment interposes the $TiSi_x$ adhesion layer 132 between the Ti 126 and TiN 136 layers whereby the $TiSi_x$ serves as a "glue" that bonds together the Ti and TiN layers. As such, the adhesion between TiN and Ti layers can be substantially improved and the occurrence of TiN peeling is substantially reduced. Furthermore, the formation of the $TiSi_x$ adhesion layer also eliminates the separate process that would otherwise be required to remove the remaining Ti film 126 from the sidewalls 123 of the contact opening 124 and top surface of the dielectric. Thus, the contact structure of the preferred embodiment provides a high aspect ratio opening with uniform metal coverage and superior adhesion of diffusion barrier layer and can be manufactured efficiently and cost-effectively.

Figure 6:
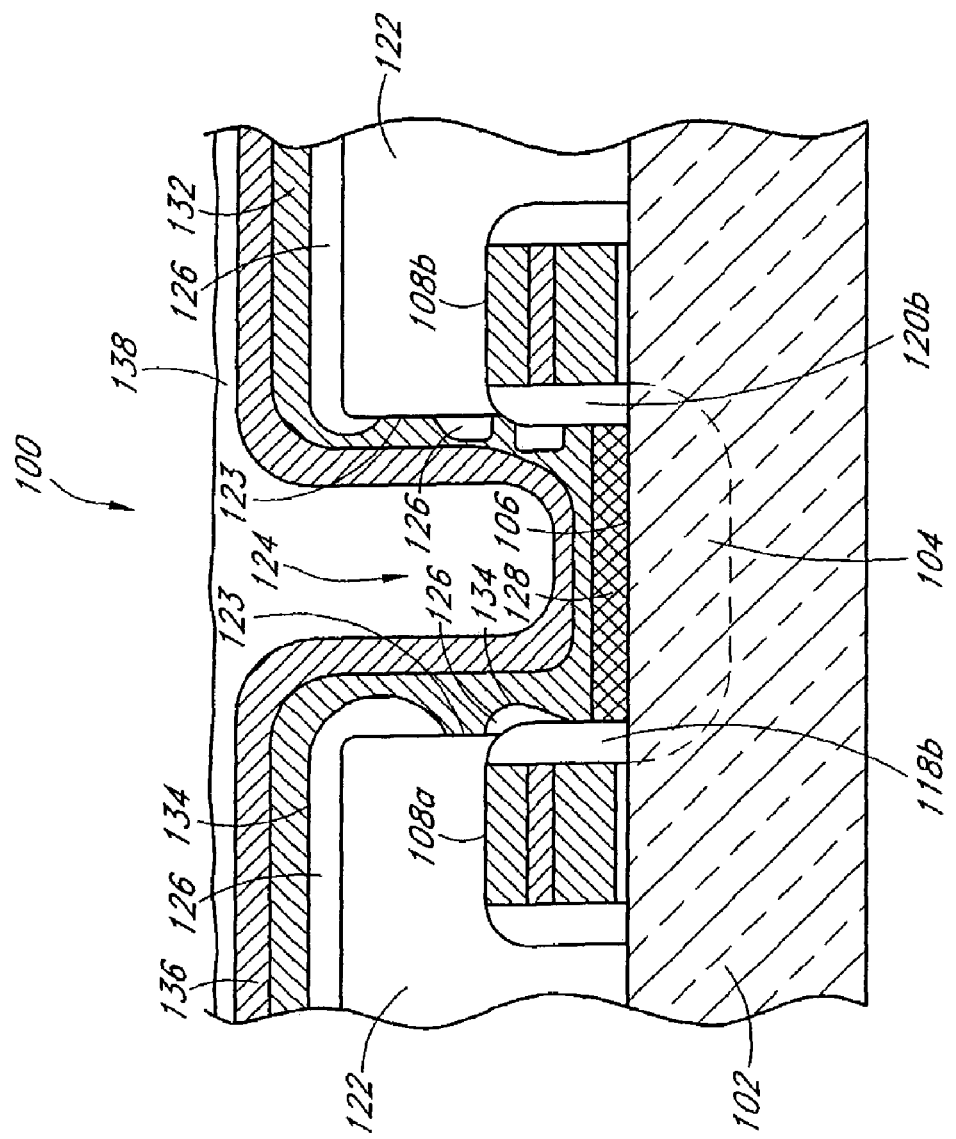
FIG. 6 illustrates a schematic cross sectional view of the integrated circuit of FIG. 5, showing the formation of a contact fill in the contact opening.

Subsequent to forming the TiN diffusion barrier layer, a contact fill 138 is deposited in the contact opening 124 as shown in FIG. 6. In one embodiment, the contact fill 138 can comprise a metal such as tungsten or copper and can be deposited using a physical deposition process such as sputtering. In another embodiment, the contact fill 138 is comprised of TiN that can be deposited using a PECVD process from precursors such as $TiCl_4$ and $TiI_4$. Advantageously, contact fills comprised of TiN are particularly suited for high aspect ratio contact openings as the TiN fill can be deposited using, for example, chemical vapor deposition techniques which provide superior step coverage. Furthermore, contact fills comprised of $TiCl_4$ TiN also have superior electrical conductivity when compared with most other conventional contact fill materials.

As described above, the contact structures of the preferred embodiments utilize a metal silicide adhesion layer to improve the adhesion between the metal and metal nitride layer in a contact structure. The metal silicide adhesion film can be fabricated cost effectively using existing equipment and processes. The preferred contact structures also utilize a chemically deposited metal nitride as contact fill so as to improve the step coverage of the contact fill. The improved step coverage is particularly desirable for high aspect ratio contact openings in which superior step coverage is difficult to achieve when using conventional metal contact fills. Moreover, the contact structures of the preferred embodiments also comprise a titanium rich titanium silicide layer that is formed without consuming a significant amount of silicon from the contact junction regions, which is particularly desirable for shallow junction regions that can be easily damaged during the conventional silicidation process.

Although the foregoing description of the preferred embodiment of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the invention. Consequently, the scope of the invention should not be limited to the foregoing discussions, but should be defined by the appended claims.

What is claimed is:

1. A method of fabricating a contact structure on a silicon substrate, comprising:

forming an insulating layer on an upper surface of the substrate;

forming an opening in the insulating layer, wherein the opening extends from an upper surface of the insulating layer to the upper surface of the substrate; and depositing a metal rich layer interspersed with a metal silicide, wherein the metal silicide is formed by reacting said metal with a dopant;

subsequently reacting the metal rich layer interspersed with a metal silicide with said silicon in the substrate, wherein the metal silicide interspersed in the metal rich layer reduces consumption of the silicon in the substrate.

2. The method of claim 1, wherein the dopant is silicon.

3. The method of claim 1, wherein said metal rich layer interspersed with a metal silicide comprises a titanium rich layer interspersed with titanium silicide.

4. A method of reducing consumption of silicon in a silicon substrate in a silicidation reaction:

depositing a metal rich layer interspersed with a metal silicide on an upper surface of said silicon substrate, wherein the metal silicide is formed by reacting said metal with a dopant; and subsequently reacting said metal rich layer with silicon in the substrate wherein the metal silicide interspersed in the metal rich layer reduces the amount of metal available for reacting with the silicon in the substrate during the silicidation reaction.

5. The method of claim 4, wherein the dopant is silicon.

6. The method of claim 4, wherein said metal comprises titanium.

* * * * *